(12) United States Patent
Amer

(10) Patent No.: US 7,185,268 B2
(45) Date of Patent: Feb. 27, 2007

(54) MEMORY SYSTEM AND METHOD FOR USE IN TRELLIS-BASED DECODING

(76) Inventor: Maher Amer, 391 Beatrice Road, Nepean, Ontario (CA) K2J 4Y7

( * ) Notice: Subject to any disclaimer, the term of this patent is extended or adjusted under 35 U.S.C. 154(b) by 596 days.

(21) Appl. No.: 10/377,860

(22) Filed: Feb. 28, 2003

(65) Prior Publication Data

US 2004/0172583 A1 Sep. 2, 2004

(51) Int. Cl.
*H03M 13/03* (2006.01)

(52) U.S. Cl. ............ 714/794; 714/795; 714/796; 714/792; 375/262; 375/341; 375/365

(58) Field of Classification Search ........ 714/791–794, 714/795, 796, 755, 786; 375/341, 265, 262
See application file for complete search history.

(56) References Cited

U.S. PATENT DOCUMENTS

| 4,606,027 | A | * | 8/1986 | Otani ..................... 714/795 |
| 4,614,933 | A | * | 9/1986 | Yamashita et al. ........ 341/51 |
| 5,329,537 | A | | 7/1994 | Alard et al. ............... 371/43 |
| 5,418,795 | A | * | 5/1995 | Itakura et al. ........... 714/746 |
| 5,596,604 | A | * | 1/1997 | Cioffi et al. ............. 375/260 |
| 5,802,115 | A | | 9/1998 | Meyer ..................... 375/341 |
| 6,868,521 | B2 | * | 3/2005 | Cohen ..................... 714/795 |
| 2002/0031195 | A1 | * | 3/2002 | Honary ..................... 375/341 |

FOREIGN PATENT DOCUMENTS

| EP | 0543554 | A1 | 5/1993 |
| EP | 0553050 | A1 | 7/1993 |
| EP | 0762659 | A2 | 3/1997 |
| EP | 0762659 | A3 | 3/1997 |
| WO | WO02/21699 | A2 | 3/2002 |
| WO | WO02/021699 | A3 | 3/2002 |

OTHER PUBLICATIONS

PCT Communication Relating To The Results Of The Partial International Search for Application No. PCT/CA2004/000282.
E. Paaske et al., *An area-efficient path memory structure for VLSI implementation of high speed Viterbi decoders*, 8220 Integration, The VLSI Journal, Nov. 1991, No. 1, pp. 79-91, Amsterdam, NL.

(Continued)

*Primary Examiner*—Guy J. Lamarre
(74) *Attorney, Agent, or Firm*—Berkeley Law & Technology Group LLP.

(57) ABSTRACT

Systems and modules for use in trellis-based decoding of encoded sets of data bits. A memory system has multiple arrays for storing an index for each one of multiple states. With each array element being associated with a state through which a decoding path may pass through, the contents of each array element is an index which points to an immediately preceding state. This immediately preceding state is represented by another array element in another array. Each array is populated with array element entries as encoded data set are received by a separate decoder which generates the indices. For every given number of arrays in a group, a trace-back process traces back the path followed by an encoding procedure for encoding the encoded set. By tracing back this path through the various arrays, the original unencoded set of data bits can be found.

15 Claims, 4 Drawing Sheets

OTHER PUBLICATIONS

G. Fettweis et al., *Feedforward Architectures for Parallel Viterbi Decoding*, Journal of VLSI Signal Processing, 3, pp. 105-119 (1991).

Proakis, John G., Chapter 8—Block and Convolutional Channel Codes, Digital Communications, Third Edition, pp. 483-500, McGraw-Hill, Inc.

* cited by examiner

FIG. 1C

| | | | | | | | |
|---|---|---|---|---|---|---|---|
| ARRAY 2 | 1 | 2 | 4 | 5 | 0 | 3 | 6 |
| ARRAY 1 | 5 | 6 | 0 | 1 | 3 | 4 | 2 |
| ARRAY 0 | 0 | 0 | 0 | 0 | 0 | 0 | 0 |

| | 0 | 1 | 2 | 3 | 4 | 5 | 6 |
|---|---|---|---|---|---|---|---|
| ARRAY 9 | 5 | 4 | 3 | 8 | 2 | 1 | 0 |
| ARRAY 8 | 6 | 1 | 5 | 4 | 3 | 2 | 0 |
| ARRAY 7 | 3 | 4 | 1 | 5 | 6 | 2 | 0 |
| ARRAY 6 | 3 | 4 | 6 | 5 | 0 | 2 | 1 |
| ARRAY 5 | 0 | 1 | 6 | 2 | 5 | 3 | 4 |
| ARRAY 4 | 6 | 1 | 5 | 0 | 4 | 2 | 3 |
| ARRAY 3 | 1 | 2 | 3 | 0 | 4 | 6 | 5 |
| ARRAY 2 | 1 | 2 | 4 | 5 | 0 | 8 | 6 |
| ARRAY 1 | 5 | 6 | 0 | 1 | 3 | 4 | 2 |
| ARRAY 0 | 0 | 0 | 0 | 0 | 0 | 0 | 0 |

10J

10A

|         | 0 | 1 | 2 | 3 | 4 | 5 | 6 |
|---------|---|---|---|---|---|---|---|
| ARRAY 9 | 6 | 4 | (3) | 5 | 2 | 1 | 0 |
| ARRAY 8 | 6 | 1 | 5 | (4) | 3 | 2 | 0 |
| ARRAY 7 | 3 | 4 | 1 | 5 | (6) | 2 | 0 |
| ARRAY 6 | 3 | 4 | 6 | 5 | 0 | 2 | (1) |
| ARRAY 5 | 0 | (1) | 6 | 2 | 5 | 3 | 4 |
| ARRAY 4 | 6 | (1) | 5 | 0 | 4 | 2 | 3 |
| ARRAY 3 | 1 | (2) | 3 | 0 | 4 | 6 | 5 |
| ARRAY 2 | 1 | 2 | (4) | 5 | 0 | 3 | 6 |
| ARRAY 1 | 5 | 6 | 0 | 1 | (3) | 4 | 2 |
| ARRAY 0 | 0 | 0 | 0 | (0) | 0 | 0 | 0 |

FIG. 2

MEMORY SYSTEM AND METHOD FOR USE IN TRELLIS-BASED DECODING

FIELD OF THE INVENTION

The present invention relates to decoding of data for use in telecommunications applications and is particularly applicable but not limited to memory systems and memory related methods useful in trellis-based decoding of encoded data.

BACKGROUND TO THE INVENTION

The communications revolution of the 1990's has led to an explosion of growth in the wireless communications field. Wireless telephones, personal communications services (PCS) devices, and wireless computer networks are just a few of the products of this revolution. One problem with this proliferation of wireless technology is the increasing need for faster transmission rates between nodes in a wireless network. Regardless of whether data or voice transmissions are being made, the encoded transmissions need to be decoded faster so that the decoding process does not become the bottleneck in the system.

One method of decoding which has gained wide acceptance is the so called Viterbi method or algorithm. In this trellis-based method, convolutionally encoded data sets are sequentially decoded by determining the states through which the encoded data sets passed through in its encoding procedure. By following this path, the original unencoded set of data bits can be found. This process usually requires large amounts of memory as each state has to be stored and processed. Furthermore, such a process can be time consuming and, therefore, be a hindrance to higher transmission rates.

There is therefore a need for methods and/or devices which allow for quicker determination of the unencoded set of data bits. Ideally, such a solution should also require less resources.

SUMMARY OF THE INVENTION

The present invention provides systems and modules for use in trellis-based decoding of encoded sets of data bits: A memory system has multiple arrays for storing an index for each one of multiple states. With each array element being associated with a state through which an encoding path may pass through, the contents of each array element is an index which points to an immediately preceding state. This immediately preceding state is represented by another array element in another array. Each array is populated with array element entries as encoded data sets are received by a separate decoder which generates the indices. For every given number of arrays in a group, a trace-back process traces back the path followed by an encoding procedure for encoding the encoded set. By tracing back this path through the various arrays, the original unencoded set of data bits can be found.

In a first aspect, the present invention provides a memory system for use in trellis-based decoding of convolutionally encoded data bits, the memory system comprising:
  storage means for storing indices in a plurality of arrays, each index denoting an element position in an immediately preceding array.

In a second aspect, the present invention provides a method of decoding a plurality of convolutionally encoded sets of data bits, the method comprising:

a) for each encoded set of data bits, receiving a plurality of indices, each index being associated with a present state and each index denoting a predecessor state;
b) storing said plurality of indices in a separate array such that each element in the array contains an index and each column in the array in associated with a present state; and
c) for every group of x arrays received for which an end state is encountered, performing a trace-back process to retrieve an original unencoded set of data bits.

In a third aspect, the present invention provides computer readable media having encoded thereon computer readable and executable code for implementing a method of decoding a plurality of convolutionally encoded sets of data bits, the method comprising:
a) for each encoded set of data bits, receiving a plurality of indices, each index being associated with a present state and each index denoting a predecessor state;
b) storing said plurality of indices in a separate array such that each element in the array contains an index and each column in the array in associated with a present state; and
c) for every group of x arrays received for which an end state is encountered, performing a trace-back process to retrieve an original unencoded set of data bits.

In a fourth aspect, the present invention provides a memory system for use in trellis-based decoding of convolutionally encoded data bits, the memory system comprising:
  a plurality of shift registers each have multiple shift register entries coupled such that contents of one register can be shifted to an immediately succeeding register;
  a plurality of multiplexers, each multiplexer corresponding to a specific shift register, wherein
  at least one multiplexer selects a specific shift register entry in a corresponding shift register based on input from an immediately preceding multiplexer and a portion of a first address used to reference a selected shift register entry in an immediately preceding shift register.

BRIEF DESCRIPTION OF THE DRAWINGS

A better understanding of the invention will be obtained by considering the detailed description below, with reference to the following drawings in which:

FIGS. 1A–1D illustrate a memory system composed of arrays as they are being populated by sequences of metrics;

FIG. 2 illustrates a trace-back process using the memory system as represented in FIG. 1D.

DETAILED DESCRIPTION

Trellis-based decoding uses multiple similar calculations for each step or state in the trellis, with multiple states forming every transition in a trellis diagram. Each of the multiple states is derived from a finite number of states in the sequence as determined by a state diagram. Each transition is calculated whenever a new set of encoded bits arrive and, for every one of the states, multiple similar calculations are performed.

The idea behind such trellis based decoding is that each encoded set resulted from a small number of possible unencoded sets of bits. Using a state diagram which details the possible transformations that an unencoded set may undergo and knowing beforehand the possible end states for each transformation, the transformations can be mapped for the encoded set. Since the possible states are finite in number, the encoded set is compared to each state and a metric or measurement of how different the encoded set from each state is generated. This process is detailed, along with the equipment which may be used in co-pending patent application entitled SYSTEMS AND MODULES FOR USE WITH TRELLIS-BASED DECODING, U.S. application Ser. No. 10/377,859 filed Feb. 28, 2003, and which is hereby incorporated by reference.

Once the metrics between the encoded set and each of the states are calculated, these can then be used to determine a predecessor state for the current state. In essence, trellis-based decoding receives a set of encoded bits at each transition and, for each transition, multiple possible states exist. Each one of these states can, at the next transition, lead to at least one state in the next transition or to a null state if this particular path ends. By mapping the states in every transition and tracing the route or path back from a final state, the original unencoded bits can be found. The present invention allows for the quick and simple tracing of the route or path back from a final state.

A memory system consisting of multiple arrays is used with each array being populated as representations of predecessor states arrive from a separate decoder component. The details of this decoder component are to be found in the previously mentioned co-pending application. Assuming there are x possible states through which a decoding path may pass through, there would be x predecessor states and therefore x array elements per array. Each predecessor state (and therefore each array element) consists of an index indicating which state was the previous state in the path. Since each array element represents one state, the contents of an array element points to the array element which represents the immediately preceding state. Of course, there are also x possible paths so all paths have to be tracked until a final state is reached. Once the final state is reached, the array element representing this final state is the starting point for a trace-back process.

Figure 1A:
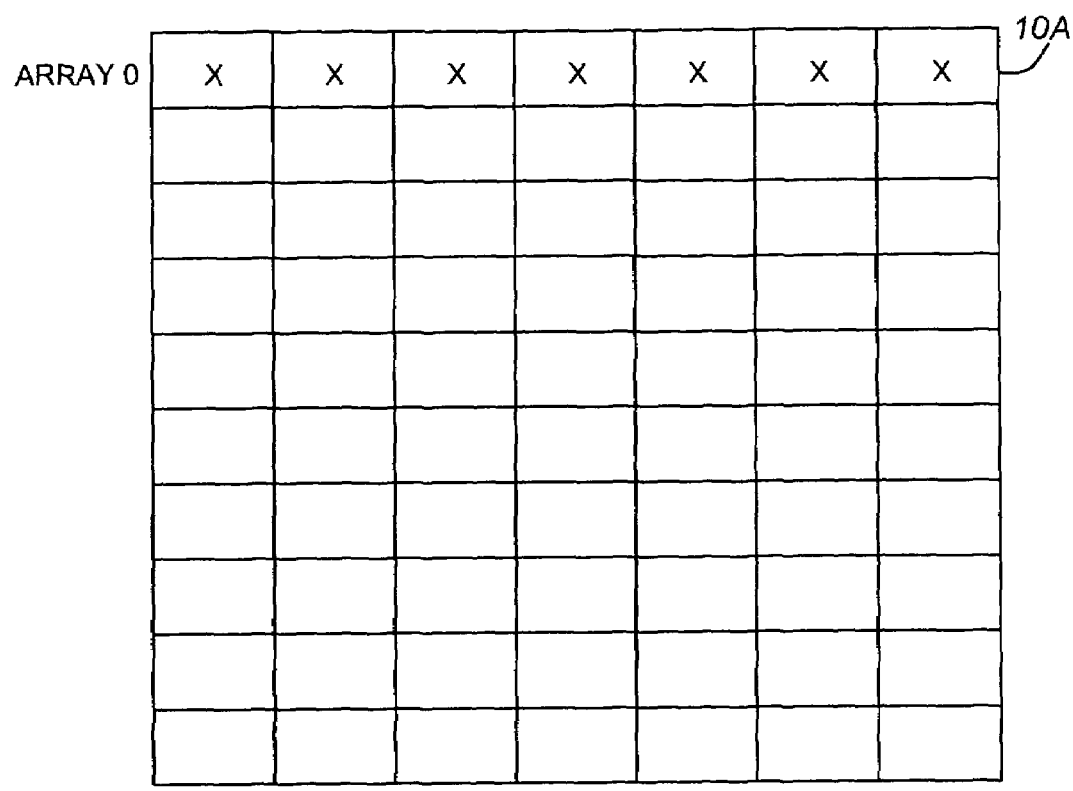

Referring to FIGS. 1A–1D, a sequence of predecessor state representations are shown arriving and being stored in a number of arrays 10A–10J. In FIG. 1A, a first batch of undefined predecessor states (represented by x) has arrived and has been stored in array 10A (array0). Each column in the arrays 10A–10J represent a separate state through which an encoding path may pass. Since each array element is to have as its content the array element position representing a previous state, the first batch are all undefined.

Figure 1B:
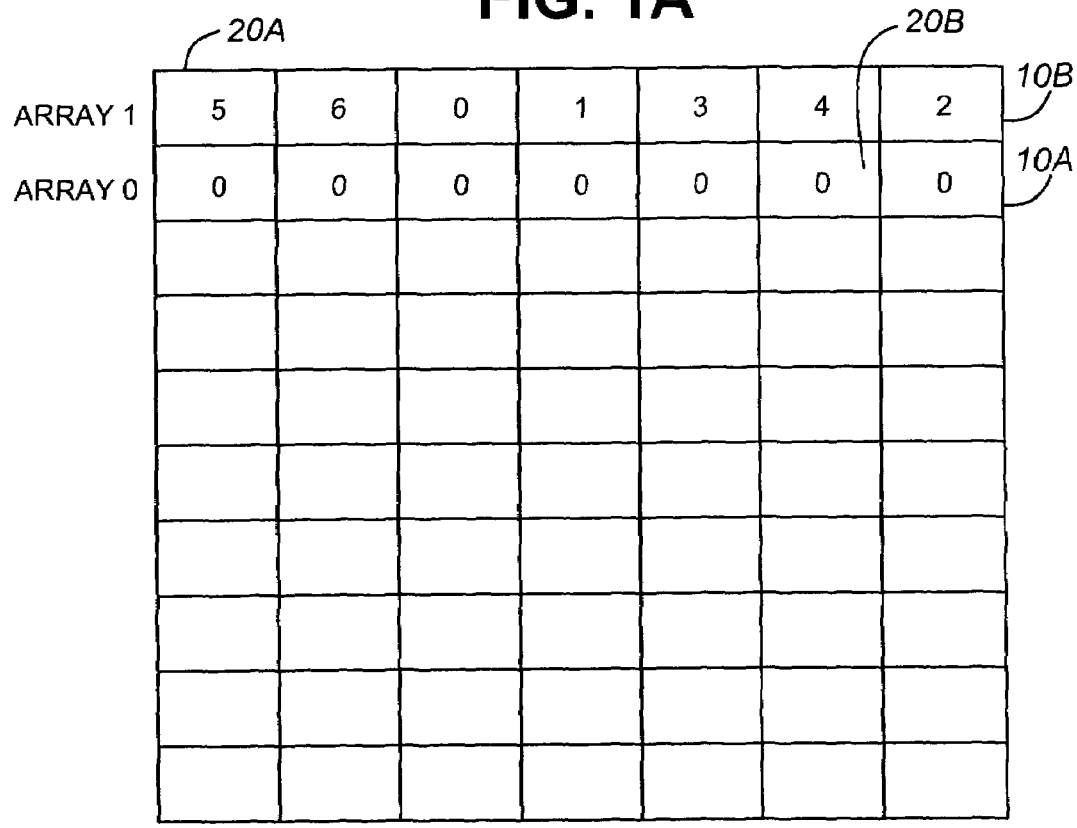

Referring to FIG. 1B, a second batch of predecessor states has arrived and has been stored in array 10B (array1). As can be seen, for array 10B, each array element has a different number as its content. Each content therefore refers (as an index) to an array element in array10A (array0). Thus, array element 20A has as its content the number 5. This means that the state represented by array element 20A resulted from the state represented by array element 20B (corresponding to state number 5) in array10A. The other array elements and their contents in array10B have a similar function as array element 20A.

Referring to FIG. 1C, a third array 10C (array2) stores a newly arrived set of predecessor states. In FIG. 1D, there are 10 arrays (array0–9) populating the memory and corresponding to 10 different sets of predecessor states. As can be seen, the memory is akin to a stack with array 0 being "pushed" further down the stack as more and more sets of data are received. In the example, provided merely for illustrative purposes, the memory system has 7 array elements per array and with 10 different arrays. In FIG. 1D, the memory system is "full" with all arrays fully populated.

Referring to FIG. 2, a trace-back process is illustrated using the memory system represented in FIG. 1D. As can be seen, each column is numbered 0–6 and each array element entry refers to one of these columns. With each column representing one of the 7 states through which an encoding process can go through, each array element recounts the previous state from which its present state derives. Therefore, if a final state can be determined, tracing back through the memory system will ultimately yield the initial, and therefore unencoded, state. As an example of the trace-back process, in FIG. 2, this final state is taken to be state 2 or the third column with an entry of 3 in the most recently received array. Since this means the previous state was state 3, the contents of state 3 are therefore retrieved (having a content of 4) to find the next previous state. The process then continues as each previous state is revealed and traced back to the original unencoded state. Clearly, the process begins with the most recently received set of predecessor states (array9) and proceed with each successively "older" set of predecessor states. Thus, as shown by the arrows in FIG. 2, one array element is successively chosen for each array. The sequence of arrays for this process is clear—each selected array element in each array is determined by an array element content in an immediately preceding array. Thus, for array2, the selected array element (the element in position 2) is determined by the contents of array element 1 in array3. It should be noted that the numbering of the arrays is such that the lower the array number, the "older" or less recently received an array is.

From FIG. 2, it can then be seen that, by following or tracing back the sequence of states, as represented by the array elements, the original unencoded state is state 3. The final state (state or array element or column 2 in array9) can be triggered by an external source. This source can be the same source for the sets of predecessor states which are used to populate the memory system.

In one embodiment, the predecessor states and the final state are all provided simultaneously to the memory system. Thus, when each array is populated, one of the array entries is designated as a "final" state. For this embodiment, the "final" state is the state which currently has the lowest cumulative metric value (i.e. currently winning) as determined by a subsystem external to the memory system. Therefore, for each set of predecessor states, there are two types of information being sent to the memory system—the set of predecessor states and a "final" or currently winning state. This "final" or currently winning state is the starting point for the trace-back process. It should be noted that a "final" or currently winning state for one transition may not be the "final" or currently winning state for the next transition. It should further be noted that the term "final" state is to mean the starting point of the trace-back process as defined by an external source. This "final" state may be the state with the lowest cumulative metric of all the states (e.g. lowest cumulative Hamming distance) or it may be the state which conforms to some other criterion for defining the starting point for a trace-back process. The Viterbi algorithm, for which the present memory system would be very suitable, dictates a "latency" value of 4 to 5 times the constraint length, a property of the encoder. The latency value is the number of sets of data or predecessor states required to find or confirm the validity of the unencoded set of data bits. Thus, a latency value of 40 means 40 sequential sets of predecessor states are required to find the unencoded data set for the $1^{st}$ encoded data set. For a constraint length of 7, a latency value of 35 is required—meaning that for every 35 sets of sequential sets of predecessor states, a single unencoded set can be found. This assumes a two bit encoded input data set. In one implementation using a six bit encoded input data set, a latency value of 16 was found to be adequate.

The above discussion therefore means that, whatever the latency value is for an encoder/decoder, the memory system needs at least this "depth" for proper functioning. Thus, a latency value of 16 requires that the memory system have at least 16 arrays to accommodate enough sets of metrics for each unencoded data set. Subsequent arriving sets of metrics can simply "push" down the previous sets. The last or least recently received set is therefore pushed off or discarded as each set of predecessor states arrive.

In one implementation, a latency value of 20 was used with 64 array elements (64 possible states) per array. Each array element was given a three bit area for storage. This amounted to a total memory area of 3840 bits or about 3.8 kB. Such savings in storage area are achieved by realizing that, instead of six bits to encode 64 possible states, each previous state shared 3 bits with its successor state. As such, only 3 bits are required to encode the sequences. In this implementation, the three bits represented by each state was the original unencoded 3 bit data set that produced the encoded 6 bit input.

Figure 3:
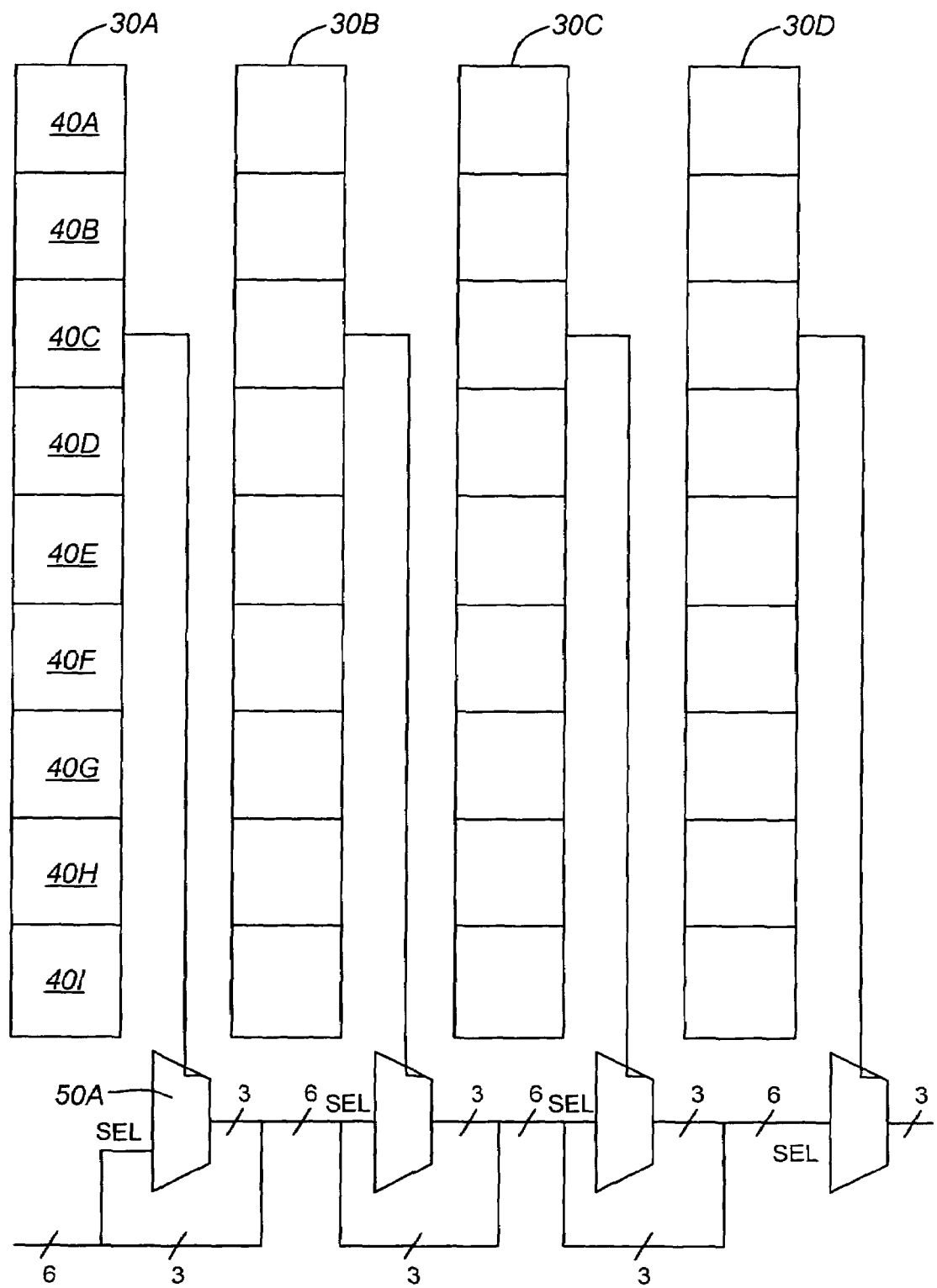
FIG. 3 illustrates a memory system using a series of registers and multiplexers to assist in the trace-back process.

To simplify the trace-back process, FIG. 3 provides a schematic illustration of a memory system using a number of shift registers as the memory cells. Each register 30A–30D has multiple cells 40A–40I, each of which represents an array element entry. Each register 30A–30D represents one set of predecessor states for one transition of a trellis-based decoding method. For the Viterbi process, each register represents the received predecessor states for all possible states in one transition period. For the 64 state implementation discussed above, each register would have 64 cells and there would be at least 20 registers to correspond to the latency value of 20.

It should be noted that each register cell/array element would have room for a 3 bit value. As noted above, this is to take advantage of the fact that each 6 bit present state shares 3 bits with its predecessor state and 3 bits with its successor state. Thus, if a present state had $A_0A_1A_2B_0B_1B_2$ as its bits, its predecessor state would be $X_0X_1X_2A_0A_1A_2$ with $X_1X_2X_3$ representing unknown bits. Its successor state would be $B_0B_1B_2Y_0Y_1Y_2$, again with $Y_0Y_1Y_2$ as unknown bits. This system can also be implemented using other numbers of bits. As another example, for a one bit implementation using a six bit present state, one bit is saved and five bits are used from the previous state. Other number combinations between the number of bits saved and the number of bits used from the previous state are also possible.

To take advantage of this fact, the memory system of FIG. 3 incorporates multiplexers 50A–50D as a means of selecting the predecessor states for a given present state. Thus, for a given index referencing a selected cell/array element in register 30A, multiplexer 50A selects that selected cell/array element and retrieves its contents. Then, three bits from the 6 bit value used to select the selected cell/array element are used along with the three bits retrieved from that selected cell/array element to form the 6 bit value used for the next register. As an example, if the 6 bit value used to select a cell/array element in register 30A is $A_0A_1A_2A_3A_4A_5$ with $A_0A_1A_2$ being the 3 MSBs (most significant bits) then $A_0A_1A_2$ will become the 3 LSBs (least significant bits) for the 6 bit value for register 30B. The 3 MSBs for register 30B will come from the cell/array element contents retrieved from register 30A. If we assume this 3 bit cell/array content to be $B_0B_1B_2$, then the 6 bit value to be used for referencing a cell/array element in register 30B will be $B_0B_1B_2A_0A_1A_2$.

From the above description, it should be clear that once the registers are fully populated (i.e. there are "latency" registers full), then the trace-back process takes only one clock cycle. The multiplexers 50A–50D are all to be clocked simultaneously and, as soon as the signal is received for the first register, then the 3 bit output (signifying the unencoded 3 bit data set) is produced at the output of the memory system.

It should be noted that while the description of the system in FIGS. 1–2 uses the concept of a stack to accommodate incoming data set (predecessor states), the system in FIG. 3 works similarly. The registers 30A–30D can act as shift registers that shift one register section for every incoming data set. Thus, if the register 30A is the first register in the chain, upon shifting, the contents of register 30A will "shift" or move to register 30B while register 30A receives a new data set. Similarly, the contents of register 30B "shifts" to become the contents of register 30C and so on and so forth.

The above memory system is particularly useful in trellis-based decoding as each trace-back process only requires one clock cycle. A software implementation using DRAM (dynamic random access memory) or SRAM (static random access memory) may also be used. However, such an implementation will require fast clock speeds to implement the trace-back process.

The above six bit implementation which uses three bits as a carry-over from each state is particularly useful with a decoder that processes 6 bits as the input data set (as opposed to the conventional 2 bit input data set for a ½ encoding rate). The above memory system, with such a decoder system, thereby processes 3 bits per clock signal. Since for the ½ encoding rate, each 2 bit encoded data set corresponds to a single unencoded bit, then by processing 6 encoded bits at a time, data which results in 3 unencoded bits per clock cycle is produced. Thus, if a decoding rate of about 60 Mb/s is desired, instead of providing a 60 MHz clock signal to a 1-bit serial decoder which produces 1 decoded bit per clock cycle, a 20 MHz clock signal may be provided to the above described system. Using a 20 MHz clock, 3 unencoded bits are produced per block cycle, thereby roughly equalling the data throughput of the higher clocked 1-bit decoder. Thus, a lower clock frequency can be used to produce the same output of a much higher clocked system. Similarly, equivalent results may be achieved by increasing or decreasing the clock rate of the memory system. For a higher throughput of the memory system, only a higher clock rate is required. This way, the memory system can be closely mated to the decoder system being used—the clock rate of the decoder system can be used for the memory system as well.

A person understanding this invention may now conceive of alternative structures and embodiments or variations of the above all of which are intended to fall within the scope of the invention as defined in the claims that follow.

What is claimed is:

1. A memory system for use in trellis-based decoding of convolutionally encoded data bits, the memory system comprising:

means for storing indices in one or more arrays, one or more of the indices denoting an element position in an immediately preceding array;

means for receiving, for encoded set of data bits, one or more of the indices, the indices being associated with a present state and denoting a predecessor state;

means for storing said indices in a separate array such that one or more elements in the array contains an index and one or more columns in the array is associated with a present state; and means for performing a trace-back process for one or more groups of the arrays received for which an end state is encountered, to retrieve an original unencoded set of data bits by tracing back a path followed by an encoding procedure for the encoded set of data bits.

2. A memory system according to claim 1 wherein each array has x elements and said trellis-based decoding allows for x possible states.

3. A memory system according to claim 1 wherein said means for performing a trace-back process comprises:
   for one or more arrays in a group of x arrays except for a most recently received array in said group and for an earliest received array in said group,
      means for referencing and retrieving contents of an array element using contents of an in an immediately succeeding array,
      means for using said contents of said array element referenced and retrieved by said referencing means to reference and retrieve contents of an array element of an immediately preceding array,
   for said most recently received array,
      means for retrieving contents of an end array element in said most recently received array, said end array element denoting and end slate in a trellis-based decoding process,
      means for referencing and retrieving contents of an array element in an immediately preceding array using said contents of said end array element,
   for said earliest received array in said group,
      means for referencing an initial array element referenced by contents of an array element in an immediately succeeding array,
      means for determining a state represented by an initial column to which said initial array element belongs and determining a state associated with said initial column,
      means for determining said original unencoded set of data bits using said state determined by said state determining means.

4. A method of decoding one or more convolutionally encoded sets of data bits, comprising:
   for each one or more encoded set of data bits, receiving one or more indices, the indices being associated with a present state and denoting a predecessor state;
   storing said indices in a separate array such that one or more elements in the array contains an index and one or more columns in the array is associated with a present state; and
   for one or more aroups of the arrays received for which an end state is encountered, performing a trace-back process to retrieve an original unencoded set of data bits.

5. A method according to claim 4 wherein said performing a trace-back process comprises:
   for array in said group of arrays except for a most recently received array in said group and for an earliest received array in said group,
      referencing and retrieving contents of an array element using contents of an immediately succeeding array,
      using said contents of said array element referenced and retrieved in said referencing and retrieving to reference and retrieve contents of an array element of an immediately preceding array,
   for said most recently received array,
      retrieving contents of an end array element in said most recently received array, said end array element denoting an end state in a trellis-based decoding process,
      referencing and retrieving contents of an array element in an immediately preceding array using said contents of said end array element,
   for said earliest received array in said group,
      referencing an initial array element referenced by contents of an array element in an immediately succeeding array,
      determining a state represented by an initial column to which said initial array element belongs and determining a state associated with said initial column,
      determining said original unencoded set of data bits using said state determined in said state determining.

6. An article of manufacture comprising a computer readable medium having encoded thereon computer readable and executable code that, if executed, results in decoding one or more convolutionally encoded sets of data bits, by:
   for each one or more encoded set of data bits, receiving one or more indices, being associated with a present state and denoting a predecessor state;
   storing said indices in a separate array such that one or more elements in the array contains an index and one or more columns in the array is associated with a present state; and
   for one or more groups arrays received for which an end state is encopntered, performing a trace-back process to retrieve an original unencoded set of data bits.

7. An article of manufacture according to claim 6 wherein said trace-back process comprises:
   for one or more of the arrays except for a most recently received array and for an earliest received array,
      referencing and retrieving contents of an array element using contents of an in an immediately succeeding array,
      using said contents of said array element referenced and retrieved in said referencing and retrieving to reference and retrieve contents of an array element of an immediately preceding array,
   for said most recently received array,
      retrieving contents of an end array element in said most recently received array, said end array element denoting an end state in a trellis-based decoding process,
      referencing and retrieving contents of an array element in an immediately preceding array using said contents of said end array element,
   for said earliest received array,
      referencing an initial array element referenced by contents of an array element in an immediately succeeding array,
      determining a state represented by an initial column to which said initial array element belongs and determining a state associated with said initial column,
      determining said original unencoded set of data bits using said state determined in said state determining.

8. A memory system for use in treflis-based decoding of convolutionally encoded data bits, the memory system comprising:
   one or more shift registers having multiple shift register entries coupled such that contents of one register can be shifted to an immediately succeeding register; and one or more multiplexers, corresponding to a specific shift register, wherein at least one multiplexer selects a specific shill register entry in a corresponding shift register based at least in part on input from an immediately preceding multiplexer and a portion of a first address used to reference a selected shift register entry in an immediately preceding shift register;

wherein a first predetermined number of most significant bits of said first address are used as the predetermined number of least significant bits of a second address used to reference said corresponding shift register.

9. A memory system according to claim 8 wherein said input is a portion of contents of said specific shift register entry.

10. A memory system according to claim 8 wherein a first predetermined number of most significant bits of said first address are used as a last predetermined number of least significant bits of a second address used to reference said corresponding shift register.

11. A memory system according to claim 10 wherein each address used to reference a shift register comprises twice the predetermined number of bits.

12. A memory system according to claim 10 wherein the most significant bits of said second address are derived from a portion of contents of said specific shift register entry.

13. A memory system according to claim 8 wherein each shift register has 64 entries.

14. A memory system according to claim 8 wherein each shift register entry has three bits.

15. A memory system according to claim 8 wherein said plurality of shift registers comprises 20 shift registers.

* * * * *

UNITED STATES PATENT AND TRADEMARK OFFICE
CERTIFICATE OF CORRECTION

PATENT NO. : 7,185,268 B2  Page 1 of 1
APPLICATION NO. : 10/377860
DATED : February 27, 2007
INVENTOR(S) : Amer It is certified that error appears in the above-identified patent and that said Letters Patent is hereby corrected as shown below:

At column 7, line 19, please replace "of an in an" with --of an--.
At column 7, line 28, please replace "end slate" with --end state--.
At column 7, line 47, please replace "for each one" with --for one--.
At column 7, line 54, please replace "more aroups of" with --more groups of--.
At column 8, line 23, please replace "for each one" with --for one--.
At column 8, line 31, please replace "encopntered" with --encountered--.
At column 8, line 38, please replace "of an in an" with --of an--.
At column 8, line 62, please replace "treflis-based" with --trellis-based--.
At column 9, line 1, please replace "multiplexers, corresponding" with --multiplexers corresponding--.
At column 9, line 3, please replace "shill register" with --shift register--.

Signed and Sealed this

Twenty-fourth Day of August, 2010

David J. Kappos
*Director of the United States Patent and Trademark Office*